United States Patent [19]

Flannagan

[11] Patent Number: 4,807,191
[45] Date of Patent: Feb. 21, 1989

[54] REDUNDANCY FOR A BLOCK-ARCHITECTURE MEMORY

[75] Inventor: Stephen T. Flannagan, Austin, Tex.

[73] Assignee: Motorola, Inc., Schaumburg, Ill.

[21] Appl. No.: 140,706

[22] Filed: Jan. 4, 1988

[51] Int. Cl.$^4$ .................... G11C 7/00; G11C 11/40
[52] U.S. Cl. ................................ 365/189; 365/200; 365/230
[58] Field of Search ............... 365/189, 200, 230

[56] References Cited

U.S. PATENT DOCUMENTS

| | | | |
|---|---|---|---|
| 4,604,730 | 8/1986 | Yoshida | 365/200 |
| 4,742,486 | 5/1988 | Takemae et al. | 365/189 |
| 4,757,474 | 7/1988 | Fukushi et al. | 365/189 |

Primary Examiner—Stuart N. Hecker
Assistant Examiner—Alyssa H. Bowler
Attorney, Agent, or Firm—James L. Clingan, Jr.

[57] ABSTRACT

A block architecture memory has two stacks of memory blocks. Between the two stacks are blocks of sense amplifiers. Each block of sense amplifiers is coupled to a memory block in each of the stacks of memory blocks via local data lines. Located at the bottom of each stack of memory blocks is a redundant block of columns of memory cells. There is a redundant sense amplifier located between and coupled to the redundant blocks of columns via local data lines. The redundant sense amplifier is also coupled to a redundant global data line. An input/output multiplexer is coupled to all of the global data lines. The multiplexer provides and receives external data. If one of the redundant columns is to replace a defective column for a particular address, then the redundant global data line carries data which corresponds to the external data.

8 Claims, 1 Drawing Sheet

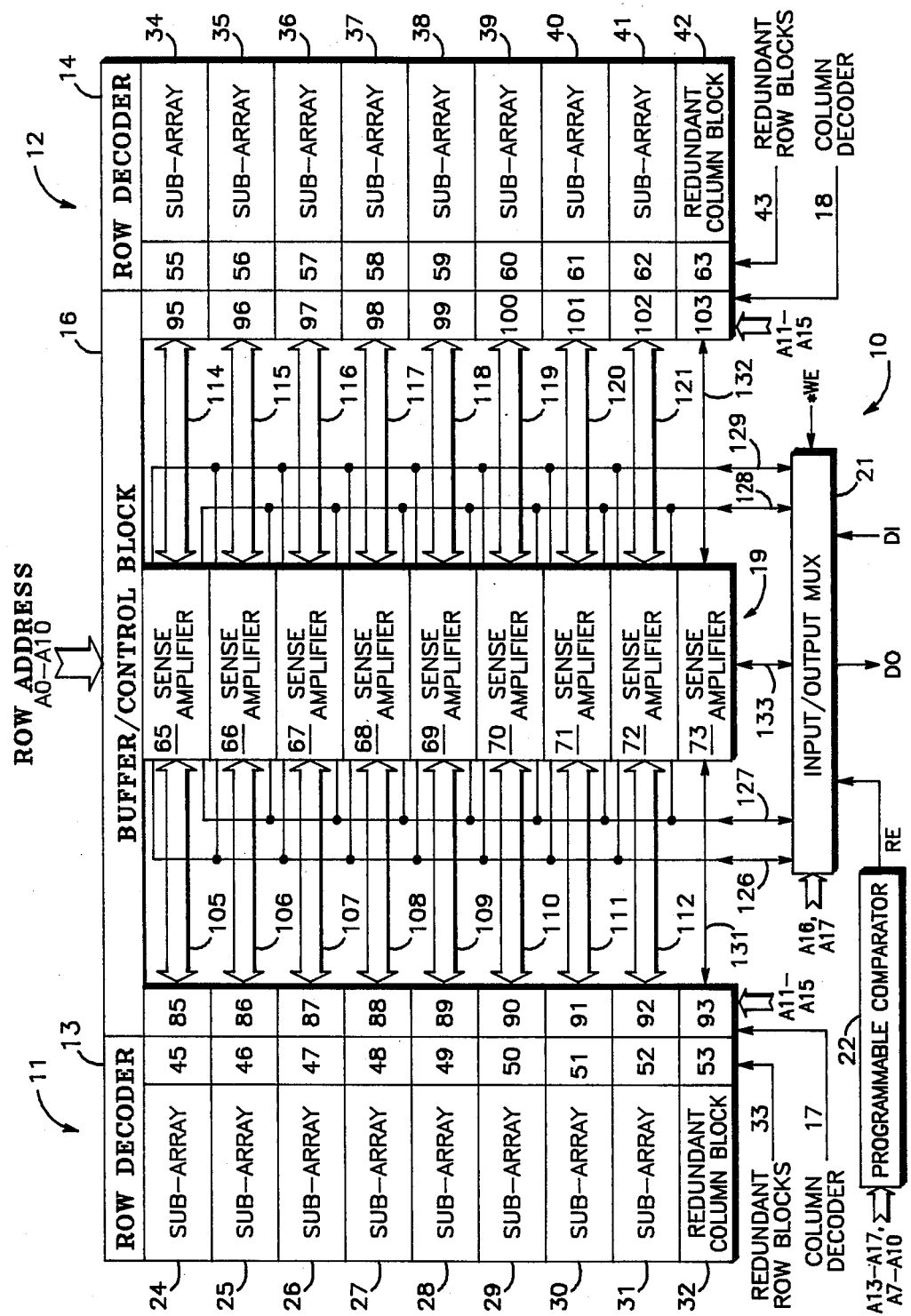

REDUNDANCY FOR A BLOCK-ARCHITECTURE MEMORY

FIELD OF THE INVENTION

The present invention relates to integrated circuit memories which have a block architecture, and more particularly, to implementing redundancy in a block architecture memory.

BACKGROUND OF THE INVENTION

Integrated circuit memories are frequently characterized as being divided into sub-arrays, or blocks, of memory cells. One of the typical reasons that a block architecture is chosen is to save power. One approach in developing block architectures in static random access memories has been the use of divided word lines. One use of divided word lines for a block architecture is shown in U.S. Pat. No. 4,698,788, Flannagan et al.

Another feature in integrated circuit memories that has been shown to have advantages is redundancy. Redundant rows and columns are included in addition to the normal array of rows and columns. The redundant rows and columns are present to replace rows and columns which are found to have one or more bad bits. Row and column decoders are programmable to perform the needed replacement. Out of hundreds of thousands of bits in the memory there may be only a few bad bits so that a small amount of redundancy can result in quite large increases in yield.

A problem that has arisen in providing redundancy in a block architecture memory is how to efficiently implement the redundancy. The problem has been that each sub-array has had its own redundant rows and columns. This has been inefficient use of redundancy because the redundant rows and columns could only replace defective rows and columns in the same sub-array as that of the redundant rows and columns. This has greatly multiplied the total number of redundant rows and columns required to provide good utility of redundancy.

Another aspect of redundancy that has been a problem is in the case of the memory having a byte-wide (×8) or nibble-wide (×4) output. In such a memory, each column comprises a plurality of bit lines or bit line pairs. Typically a redundant column would be required to replace a column which had defective bits although only a single bit line or bit line pair may be defective. This then is an inefficient use of redundancy. A solution to this problem was described in U.S. Pat. No. 4,601,019, Shah et al but still required a redundant column for each block.

SUMMARY OF THE INVENTION

An object of the invention is to provide an improved architecture for an integrated circuit memory.

Another object of the present invention is to provide an improved block-architecture memory.

Yet another object of the invention is to provide an architecture for a memory which results in more efficient use of redundancy.

There is then shown a novel architecture that is advantageous with respect to implementing redundancy. There is an advantage obtained by the location of the features of the novel memory. There are two stacks of memory blocks with blocks of sense amplifiers therebetween. There are two blocks of redundant columns of memory cells, each block being at the bottom of a corresponding stack of memory blocks. A sense amplifier for the two blocks of redundant columns of memory cells is located therebetween. As yet another aspect of the location of a feature of the memory, there is an input/output circuit coupled to all of the sense amplifiers also below the two stacks of memory blocks. Viewed from a more functional viewpoint, the memory has a plurality of sub-arrays, selectively enabled, which each have associated therewith a set of local data lines. There is a plurality of blocks of sense amplifiers. Each set of local data lines is associated with a block of sense amplifiers. There is a set of global data lines which carry the same data as that of the local data lines of the sub-array which is enabled. There is a block of redundant columns which is coupled to a redundant sense amplifier. The redundant sense amplifier is also coupled to a redundant global data line pair. The input/output multiplexer selects the redundant global data line pair for carrying data if the memory detects that a redundant column is to replace a column which has been selected by the address.

BRIEF DESCRIPTION OF THE DRAWINGS

The FIGURE is a block diagram of a memory according to a preferred embodiment of the invention.

DESCRIPTION OF THE INVENTION

Shown in the FIGURE is a memory 10 comprised generally of a left stack of sub-arrays 11, a right stack of sub-arrays 12, a left row decoder 13, a right row decoder 14, a buffer/control block 16, a left column decoder 17, a right column decoder 18, a plurality of sense amplifier blocks 19, an input/output multiplexer 21, and a programmable comparator 22. Stack of sub-arrays 11 comprises sub-arrays 24, 25, 26, 27, 28, 29, 30, and 31; redundant column block 32; and a plurality of redundant row blocks 33. Stack of sub-arrays 12 comprises sub-arrays 34, 35, 36, 37, 38, 39, 40, and 41; redundant column block 42; and a plurality of redundant row blocks 43. Plurality of redundant row blocks 33 comprises redundant row blocks 45, 46, 47, 48, 49, 50, 51, 52, and 53. Plurality of redundant row blocks 43 comprises redundant row blocks 55, 56, 57, 58, 59, 60, 61, 62, and 63. Plurality of sense amplifier blocks 19 comprises sense amplifier blocks 65, 66, 67, 68, 69, 70, 71, 72, and 73. Column decoder 17 comprises logic decoders 85, 86, 87, 88, 89, 90, 91, 92, and 93. Column decoder 18 comprises logic decoders 95, 96, 97, 98, 99, 100, 101, 102, and 103. Each of sub-arrays 24–31 and 34–41 comprise memory cells located at intersections of 128 bit line pairs and 128 word lines so that each contains about 16K static random access memory (SRAM) cells. Memory 10 is what is commonly known as a 256K SRAM. There is one data input for an input signal DI and one data output for an output signal DO. Memory 10 is organized as a by one (×1) so that memory 10 is a 256K×1 SRAM. For each address, comprised of address signals A0–A17, one memory cell is selected.

Each sense amplifier block 65–72 is coupled to a pair of sub-arrays, one from the left plurality and one from the right plurality, via local data line pairs. In particular, sense amplifier blocks 65–72 are coupled to sub-arrays 24–31 via local data lines 105, 106, 107, 108, 109, 110, 111, and 112, respectively, and to sub-arrays 34–41 via local data lines 114, 115, 116, 117, 118, 119, 120, and 121, respectively. Each of local data line pairs 105–112 and 114–121 comprise four data line pairs. Logic decoders 85–92 are for selectively coupling four bit line pairs from sub-arrays 24–31 to data lines 105–112, respectively. Similarly, logic decoders 95–102 selectively couple four bit line pairs to data lines 114–121, respectively. Which for bit line pairs that are selected are determined by the logic state of signals A11–A15. Only the selected sub-array of sub-arrays 24–31 and sub-arrays 34–41 is enabled. The fact that only one sub-array is enabled is the power-saving feature that is a significant reason for choosing a block architecture. One of row decoders 13 or 14 is selected by address signal A10 for enabling a selected one of the global word lines which run the length of columns of sub-arrays 11 and 12. Each sub-array has a word line driver which enables a word line which is associated with enabled global word line. Only the word line driver of the selected sub-array enables a word line. This type of architecture is commonly known as a divided word line architecture. This type of divided-word-line architecture in which there are columns of sub-arrays in which row decoders and a buffer/control block is known in the art. One such architecture is described in U.S. Pat. No. 4,698,788, Flannagan et al, issued Oct. 6, 1987, which is hereby incorporated by reference. Address signals A7–A10 determine which sub-array of sub-arrays 24–31 and 34–41 is selected, and address signals A0–A6 determine which word line within the selected sub-array is selected. Four global data line pairs 126, 127, 128, and 129 couple input/output multiplexer 21 to each of sense amplifier blocks 65–72.

When memory 10 is in a read mode as determined by an externally provided write enable signal *WE, the sense amplifier block of sense amplifier blocks 65–72 which is coupled to the selected sub-array senses the data on the selected four data line pairs coupled to the selected sub-array. Each of sense amplifier blocks 65–72 has four sense amplifier circuits. Each of the sense amplifier circuits is coupled to a data line pair from stack 11 and a data line pair from stack 12. There are, thus, 32 sense amplifier circuits in sense amplifier blocks 65–72. This amplified data is output onto global data line pairs 126–129 where it is received by multiplexer 21. Multiplexer 21 receives address signals A16 and A17 to define which global data line pair of global data line pairs 126–129 contains the data which is to be output as signal DO. It is apparent that memory 10 could easily be adapted to output 4 bits. Similarly, in the write mode, address signals A16 and A17 which global data line pair of global data line pairs 126–129 is to be driven to a state representative of the logic state of signal DI. All of the sense amplifier blocks receive the data but only the sense amplifier block which is coupled to the selected sub-array outputs data onto one of the data line pairs which couple the selected sub-array and the sense amplifier block. The selected sub-array then receives the data where it is written onto the selected bit line pair as determined by address signals A11–A15. Plurality of sense amplifier blocks 19 function to couple data between the global data lines and the local data lines associated with the enabled sub-array. Buffer/control block 16, which is coupled to all of the sub-arrays 24–32 and 34–41, functions to select the sub-array which is enabled as determined by the logic states of address signals A7–A10.

Redundant column blocks 32 and 42 are coupled to redundant sense amplifier 73 via redundant local data line pairs 131 and 132, respectively. Memory 10 could be designed to include additional redundant sense amplifiers and additional redundant local data line pairs. Logic column decoders 93 and 103 are programmable to operate in response to selected logic states of address signals A11–A15, as well as address signals A7–A10 which determine the selected sub-array, as is conventional for decoders used for implementing redundancy Columns in redundant column block 32 can replace defective columns in any of sub-arrays 24–31. Similarly, columns in redundant column block 42 can replace defective columns in any of sub-arrays 34–41. Sense amplifier 73 is coupled to input/output multiplexer 21 by a global data line pair 133. In the read mode, global data line 133 carries the same data as that of one of local data line pairs 131 and 132. The logic state of address signal A10 determines which of local data lines 131 and 132 is sensed and output onto global data line pair 133 by sense amplifier 73. Similarly, in the write mode, global data line pair 133 carries data which is coupled to one of local data line pairs 131 and 132 determined by address signal A10.

Comparator 22 outputs a redundancy enable signal RE to indicate that one of redundant column blocks 32 and 42 is to provide or receive data. When signal RE is generated, global data pair 133 contains valid data which has been read by sense amplifier 73 or written by multiplexer 21. Signal RE thus informs multiplexer to provide the data received from signal DI onto global data line pair 133 or to output the data present on global data line 133 as signal DO, depending on the state of signal *WE. Signal RE is generated in response to address signals A7–A10 and A13–A17 being in the logic state which would select a defective column. Comparator 22 is programmed to detect the presence of an address which would select a column for which a redundant column and its associated decoder have been programmed to replace the normally selected column. Redundancy detection using [programmable comparator such as programmable detector 21 is common in memories which have redundancy.

There is then present in memory 10 two stacks of sub-arrays in which each stack of sub-arrays has a single block of redundant columns. Each of redundant column blocks 32 and 42 is arranged in groups of four contiguous columns. Any of these groups of four contiguous columns replaces four contiguous columns in any of the sub-arrays that is in the same stack. When any bad column is replaced, not only the identified bad column is replaced but also three other columns which results in four contiguous columns in one of the sub-arrays being replaced by four contiguous columns in the redundant sub-array. This approach simplifies the redundant column decoders 93 and 103. This feature is considered advantageous but the architecture of memory 10 could be used to advantage by having only the bad column replaced by a single redundant column instead of always replacing four contiguous columns anytime column redundancy is implemented A single sense amplifier serves both redundant blocks. There is a global data line pair 133 which is the conduit for data between the input/output 21 and both redundant blocks 32 and 42. Thus the redundant global data line pair 133 can be substituted for any of the other four global data lines 126–129. This then makes the redundancy architecture of memory 10 also useful for a ×4 type configuration.

Memory 10 can easily be modified to be a ×4 memory by a relatively simple change &n input/output multiplexer 21 and programmable comparator 22. There would then be provided four data inputs and four data outputs. Address signals A16 and A17 would be eliminated. The input/output multiplexer would then substitute the redundant global data line for one of the normal global data lines for the case of a redundant column replacing a defective column. The redundancy detector would provide, in response to an address which addressed a defective column, four output signals to define which of the normal global data lines should be replaced by the redundant global data line. In a ×4 memory four column are selected for any single address thus it is possible that there will be two defective columns for a particular address. This possibility is made to be remote by having the columns which form the 4-bit word be spaced evenly along the word line. Each sub-array has 128 cells coupled to bit line pairs along each word line. The cells which are coupled to local data lines and for the four bits of the 4-bit word are 16 cells apart along the word line. Thus, for a memory which has only a few defective cells and which thus makes it a good candidate for implementing redundancy, the likelihood that two cells, which are 16 cells apart, along the same enabled word line are defective is remote unless that word line has many defects in which case that word line needs to be replaced anyway. Thus, a single global data line of redundancy, as in the architecture of memory 10, is effective for a memory which has either a single data bit or multiple data bit output.

Techniques for implementing data input/outputs for a memory are well known. Generally included are secondary sense amplifiers, output buffers, input buffers, write drivers, logic for controlling the global data line pairs in response to signals such as address signals A16 and A17 and signal *WE as well as other control signals. Five write drivers were used in multiplexer 21 but one write driver could also be used to implement multiplexer 21. Also, particularly in a ×4 memory, four write drivers could be used to implement the architecture of that of memory 10.

Thus, it will be apparent to those skilled in the art that the disclosed invention may be modified in numerous ways and may assume many embodiments other than those specifically set out and described above. Accordingly, it is intended by the appended claims to cover all modifications of the invention which fall within the true spirit and scope of the invention.

I claim:

1. A memory having a read mode and a write mode, comprising:
   a plurality of sub-arrays comprised of intersecting rows and columns of memory cells;
   a plurality of sets of local data line pairs, each set of local data lines coupled to a corresponding sub-array for carrying data to and from selected columns of the particular sub-array to which the set of local data lines corresponds;
   block-select means, coupled to the plurality of sub-arrays, for enabling a particular sub-array as determined by a first set of address signals;
   a set of global data lines for carrying data which corresponds to the data carried by the set of local data lines which corresponds to the enabled sub-array;
   first sense amplifier means, coupled to the plurality of sets of local data line pairs and the set of global data line pairs, for coupling data between the set of global data lines and the set of local data lines which corresponds to the selected sub-array;
   a block of redundant columns;
   a redundant local data line pair for carrying data to and from the block of redundant columns;
   a redundant global data line pair for carrying data;
   second sense amplifier means, coupled to the block of redundant columns via the redundant local data line pair, for coupling data between the redundant global data line pair and the redundant local data line pair;
   detection means for detecting when a column in the block of redundant columns is to replace a column in one of the sub-arrays of the plurality of sub-arrays;
   multiplexer means, coupled to the detection means, the redundant global data line pair, and the set of global data line pairs, for outputting external data which corresponds to the data present on the redundant global data line when the memory is in the read mode and the detection means detects that a column in the block of redundant columns is to replace a column in one of the sub-arrays and for providing, onto the redundant global data line pair, external data which has been received when the memory is in the write mode and the detection means detects that a column in the block of redundant columns is to replace a column in one of the sub-arrays.

2. The memory of claim 1 wherein each sub-array has coupled thereto a column decoder circuit which couples data between the set of local data line pairs and the selected columns of the corresponding sub-array.

3. The memory of claim 2 wherein the first amplifier means comprises a plurality of sets of amplifier circuits, wherein each set of amplifier circuits is coupled to two sub-arrays.

4. The memory of claim 3 wherein the block-select means is further characterized as enabling the set of amplifier circuits which is coupled to the enabled sub-array.

5. A memory having a read mode and a write mode, comprising:
   a plurality of sub-arrays, each sub-array comprised of memory cells located at intersections of word lines and bit line pairs, said sub-arrays arranged in two columns;
   a plurality of sets of local data line pairs, each set of local data lines coupled to a corresponding sub-array for carrying data to and from selected bit line pairs of the particular sub-array to which the set of local data lines corresponds;
   block-select means, coupled to the plurality of sub-arrays, for enabling a particular sub-array as determined by a first set of address signals;
   a plurality of column decoder circuits, each column decoder circuit coupled to a corresponding sub-array for coupling data between the selected bit line pairs and the corresponding set of local data lines;
   a set of global data lines for carrying data which corresponds to the data carried by the set of local data lines which corresponds to the enabled sub-array, said set of global data lines located between the columns of sub-arrays;
   a plurality of sets of sense amplifier means located between the two columns of sub-arrays, each set of sense amplifier means coupled to one sub-array in each of the two columns of sub-arrays for amplifying and coupling data between the set of global data lines and the set of local data lines which corresponds to the selected sub-array;

first and second blocks of redundant memory cells coupled to redundant bit line pairs located at the bottom of the first and second columns of sub-arrays, respectively;

first and second redundant local data line pairs for carrying data to and from the first and second blocks of redundant memory cells, respectively;

a redundant global data line pair for carrying data;

redundant sense amplifier means, located between and coupled to the first and second blocks of redundant memory cells via the first and second redundant local data line pairs, respectively, for amplifying and coupling data between the redundant global data line pair and the first and second redundant local data line pairs;

detection means for detecting when a bit line pair in one of the first and second blocks of redundant columns is to replace a bit line pair in one of the sub-arrays of the plurality of sub-arrays; and multiplexer means, coupled to the detection means, the redundant global data line pair, and the set of global data line pairs, for outputting external data which corresponds to the data present on the redundant global data line when the memory is in the read mode and the detection means detects that a column in the block of redundant columns is to replace a column in one of the sub-arrays and for providing, onto the redundant global data line pair, external data which has been received when the memory is in the write mode and the detection means detects that a column in the block of redundant columns is to replace a column in one of the sub-arrays.

6. The memory of claim 5 wherein the block-select means is further characterized as enabling the set of sense amplifier mean which is coupled to the enabled sub-array.

7. A block-architecture memory having a plurality of memory blocks in which each memory block is comprised of a plurality of intersecting rows and columns of memory cells, wherein a block is selectively enabled for providing and receiving data via the columns of memory cells thereof, comprising:

a first stack of said memory blocks arranged from top to bottom;

a second stack of said memory blocks arranged from top to bottom;

a plurality of blocks of sense amplifiers located between the first and second stacks of memory blocks, each block of sense amplifiers coupled to a particular memory block in each of the first and second stacks of said memory blocks;

a first block of redundant columns of memory cells, located at the bottom of the first stack of memory blocks, for replacing defective columns of memory cells in any of said memory blocks of the first stack of said memory blocks;

a second block of redundant columns of memory cells, located at the bottom of the second stack of said memory blocks, for replacing defective columns of memory cells in any of said memory blocks of the second stack of said memory blocks; and a redundant sense amplifier coupled to and located between the first and second blocks of redundant columns of memory cells.

8. The memory of claim 7 wherein the number of memory blocks in each of the first and second stacks is greater than two.

* * * * *